(12) United States Patent
Huang

(10) Patent No.: US 6,677,665 B2
(45) Date of Patent: Jan. 13, 2004

(54) DUAL-DIE INTEGRATED CIRCUIT PACKAGE

(75) Inventor: Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 107 days.

(21) Appl. No.: 10/092,808

(22) Filed: Mar. 6, 2002

(65) Prior Publication Data

US 2002/0113305 A1 Aug. 22, 2002

Related U.S. Application Data

(63) Continuation-in-part of application No. 09/484,874, filed on Jan. 18, 2000, now abandoned.

(30) Foreign Application Priority Data

Jan. 18, 1999 (TW) ........................................ 88100687 A

(51) Int. Cl.$^7$ ........................ H01L 23/495; H01L 23/34
(52) U.S. Cl. ........................ 257/676; 257/666; 257/690; 257/669; 257/784; 257/723; 257/674; 257/782; 257/787
(58) Field of Search ......................... 257/666, 676, 257/723, 669, 674, 690, 784, 787; 361/813

(56) References Cited

U.S. PATENT DOCUMENTS

| 4,878,106 | A | * | 10/1989 | Sachs ........................ 357/72 |
| 5,233,222 | A | | 8/1993 | Djennas et al. |
| 5,291,061 | A | | 3/1994 | Ball |
| 5,545,922 | A | | 8/1996 | Golwalkar et al. |
| 5,677,567 | A | | 10/1997 | Ma et al. |
| 6,552,437 | B1 | * | 4/2003 | Masuda et al. ............. 257/777 |

* cited by examiner

Primary Examiner—Tom Thomas
Assistant Examiner—Nitin Parekh
(74) Attorney, Agent, or Firm—Peter F. Corless; Steven M. Jensen; Edwards & Angell, LLP

(57) ABSTRACT

A dual-die integrated circuit package is provided, which can be used to pack two semiconductor dies in the same package unit. These two semiconductor dies are of the type having an array of bonding pads formed thereon. The dual-die integrated circuit package has a first leadframe and a second leadframe, each having a die pad and a plurality of leads, with the die pad being arranged at a different elevation with respect to the leads. The two semiconductor dies are mounted on the respective die pads of the two leadframes, with the bottom surface of each semiconductor die facing the bottom surface of the other, allowing the bottom surface of one semiconductor die to be separated from the die pad of the first leadframe and the bottom surface of the other semiconductor die to be separated from the die pad of the second leadframe. This dual-die integrated circuit package structure can help prevent the interface between the semiconductor die and the die pad from delamination and eliminate contamination to the semiconductor dies and also allows the manufacture to be more cost-effective to implement than the prior art.

11 Claims, 8 Drawing Sheets

DUAL-DIE INTEGRATED CIRCUIT PACKAGE

CROSS-REFERENCE TO RELATED APPLICATION(S)

This application is a continuation-in-part of priority to U.S. Ser. No. 09/484,874, which was filed on Jan. 18, 2000 in the United States Patent and Trademark Office.

BACKGROUND OF THE INVENTION

1. Field of the Invention

This invention relates to integrated circuit (IC) packages, and more particularly, to a dual-die integrated circuit package which can be used to pack two semiconductor dies in the same package unit.

2. Description of Related Art

A dual-die integrated circuit package is a type of integrated circuit package that contains two semiconductor dies therein so that a single unit of integrated circuit package can offer a doubled level of functionality or capacity than a single-die integrated circuit package. However, needless to say, a dual-die integrated circuit package would be greater in size than a single-die integrated circuit package. To allow a dual-die integrated circuit package to be nevertheless small in size, various packaging methods have been proposed. Some of these methods are briefly depicted in the following with reference to FIGS. 6, 7, 8, 9, and 10A–10C.

FIG. 6 is a schematic sectional diagram of a first conventional dual-die integrated circuit package structure. As shown, the package structure 1 includes a leadframe having a die pad 10 for mounting two semiconductor dies including a first semiconductor die 12a and a second semiconductor die 12b. The first semiconductor die 12a is adhered to the top side of the die pad 10 through silver paste 11a, while the second semiconductor die 12b is adhered to the bottom side of the same through silver paste 11b. Further, the first semiconductor die 12a is electrically coupled to the corresponding inner leads 140 of the leads 14 via a first set of bonding wires 13a; and in a similar manner, the second semiconductor die 12b is electrically coupled to the corresponding inner leads 140 of the leads 14 via a second set of bonding wires 13b. Finally, an encapsulant 15 is formed to encapsulate the first and second semiconductor dies 12a, 12b, the die pad 10, the first and second sets of bonding wires 13a, 13b, and the inner leads 140 of the leadframe 14, while exposing the outer leads 141 of the leads 14 to the outside for external connections.

During manufacture of the package structure 1, it is required to perform the die-bonding process in two steps: a first step for mounting the first semiconductor die 12a on the upper side of the die pad 10, and then a second step, which is performed by turning the entire die pad 10 upside down, for mounting the second semiconductor die 12b on the bottom side of the die pad 10. As shown in FIG. 7, in this second step, the die pad 10 is positioned on a fixture 16, and then a presser 17 is used to press down against the second semiconductor die 12b after it is mounted on the bottom side of the die pad 10.

One drawback to the forgoing die-bonding process, however, is that since the functional surface of the first semiconductor die 12a, namely, the surface of the semiconductor die 12a on which electronic components and electric circuits are formed, comes in contact with the surface of the fixture 16, the pressing down of the presser 17 would easily cause damage to the functional surface of the first semiconductor die 12a. Moreover, during the mounting of the first semiconductor die 12a onto the die pad 10, since the die pad 10 has its bottom side come in contact with the platform of the die-bonding machine, it would easily cause contamination to the bottom side of the die pad 10 where the second semiconductor die 12b is to be mounted; and consequently, delamination would occur at the interface between the second semiconductor die 12b and the die pad 10. Still moreover, since the die-bonding process requires the die pad 10 to be turned upside down for the mounting of the second semiconductor die 12b, it would be highly difficult to align the second semiconductor die 12b precisely to the first semiconductor die 12a; if misaligned, it would degrade the quality of the resulting integrated circuit package.

Further, the subsequent wire-bonding process is also required to be performed in two steps: a first step for bonding the first set of bonding wires 13a to the first semiconductor die 12a while positioning the first semiconductor die 12a on the top side of the die pad 10, and then a second step, which is performed by turning the entire die pad 10 upside down, for bonding the second set of bonding wires 13b to the second semiconductor die 12b.

One drawback to the foregoing wire-bonding process, however, is that when the die pad 10 is turned upside down subsequent to the wire bonding of the first set of bonding wires 13a, it would easily cause the first set of bonding wires 13a to come in contact with the fixture 16, thus making the first set of bonding wires 13a easily deformed or damaged. Moreover, since the wire bonding of the first set of bonding wires 13a is carried out under a high-temperature condition and during which the bottom side 140b of the inner leads 140 comes in contact with the heating plate of the wire bonding machine, it would tend to cause the bottom side 140b of the inner leads 140 to be oxidized and contaminated, which would considerably affect the bonding quality between the second set of bonding wires 13b and the bottom side 140b of the inner leads 140.

One solution to the foregoing drawbacks is the TAB (Tape Automated Bonding) method. FIG. 8 shows a dual-die integrated circuit package which utilizes the TAB method to electrically connect the semiconductor die and the leads. As shown, the integrated circuit package 2 is used to pack two semiconductor dies including a first semiconductor die 24a and a second semiconductor die 24b, and includes a leadframe consisting of a die pad 20 and a plurality of leads 21, each having an inner lead 210 and an outer lead 211. The integrated circuit package 2 also includes a plurality of TAB leads 22a, 22b for electrical connections of the semiconductor dies 24a and the corresponding leads 21. The top TAB leads 22a have a middle section attached by an insulative tape 23a on the top side of the die pad 20, a first end electrically connected to the top surface 210a of the inner lead 210, and a second end electrically connected to the bonding pads (not shown) on the first semiconductor die 24a; and in a similar manner, the bottom TAB leads 22b have a middle section attached by an insulative tape 23b on the bottom side of the die pad 20, a first end electrically connected to the bottom surface 210b of the inner lead 210, and a second end electrically connected to the bonding pads (not shown) on the second semiconductor die 24b. This arrangement allows the two semiconductor dies 24a, 24b to be respectively electrically coupled via the TAB leads 22a, 22b to the leads 21.

The TAB technique can help eliminate the drawbacks of the dual-die integrated circuit package structure of FIG. 6. However, since the use of the TAB technique requires the bonding pads on the semiconductor dies to be made from gold, it would significantly increase the manufacture cost. Moreover, it must be implemented by the use of a special machine called a gang bonding machine, which would further increase the manufacture cost since this type of machine is quite expensive as compared to conventional wire bonding machines. Further, the TAB technique requires complex processing steps so that the resulted integrated circuit packages are less reliable than the ones having conventional bonding wires.

As a solution to the drawbacks of the foregoing two dual-die integrated circuit package structures, U.S. Pat. No. 5,545,922 proposes a dual-die integrated circuit package having offset bonding wires, as illustrated in FIG. 9. As shown, the integrated circuit package 3 is used to pack two semiconductor dies including a first semiconductor die 32a and a second semiconductor die 32b. The first semiconductor die 32a is adhered by silver paste 31a on the top side of the die pad 30, while the second semiconductor die 32b is adhered by silver paste 31b on the bottom side of the same. Further, the first semiconductor die 32a is electrically coupled via a first set of bonding wires 33a to the front sides 340b of the inner leads 340 of the leads 34, while the second semi-conductor die 32b is electrically coupled via a second set of bonding wires 33b to bottom sides 340b of the inner leads 340 of the leads 34. Finally, an encapsulant 35 is formed to encapsulate the two semiconductor dies 32a, 32b, the two sets of bonding wires 33a, 33b, and the inner leads 340 of the leads 34, while exposing the outer leads 341 of the leads 34.

The die-bonding process for the foregoing dual-die integrated circuit package includes two steps: a first step to adhere the first semiconductor die 32a onto the top side of the die pad 30; and then, with the entire die pad 30 being turned upside down and fixed on a fixture 36 as shown in FIG. 10A, a second step to adhere the second semiconductor die 32b to the bottom side of the die pad 30. During the second step, the first semiconductor die 32a is accommodated within a void portion 36a in the fixture 36, and a presser 37 is used to press down against the die pad 30 for the purpose of fixing the die pad 30 firmly in position. After this, the subsequent wire-bonding process also includes two steps, as respectively depicted in FIGS. 10B and 10C. As shown in FIG. 10B, in the first step, the die pad 30 is turned upside down to have the first semiconductor die 32a positioned above the second semiconductor die 32b, and the inner leads 340 are fixed by the fixture 36 and the presser 37 so as to fix the entire leadframe firmly in position; and then, the first set of bonding wires 33a are bonded between the first semi-conductor die 32a and the top surface 340a of the inner leads 340. Next, as shown in FIG. 10C, the semi-finished package structure is remounted on another fixture 38 having a void portion 38a for accommodating the first semiconductor die 32a and the first set of bonding wires 33a. The die pad 30 is fixed in position by clamping the inner leads 340 of the leads 34 with the presser 37 and the fixture 38. With this setup, the second step of the wire-bonding process is performed to bond the second set of bonding wires 33b between the second semiconductor die 32b and the bottom surface 340b of the inner leads 340 of the leads 34. It can be seen from FIG. 10C that the ends of the second set of bonding wires 33b coupled to the inner leads 340 are more outwardly located with respect to the ends of the first set of bonding wires 33a coupled to the inner leads 340 (the so-called offset bonding wires).

The foregoing dual-die integrated circuit package can help prevent the upside-down turned first semiconductor die 32a and the first set of bonding wires 33a from coming in contact with any surface of the fixture that would otherwise cause damage to the functional surface of the first semiconductor die 32a and the bonding wires 33a. However, it still has the following drawbacks.

First, after the die-bonding process for the first semiconductor die 32a is completed, the subsequent curing process would cause the bottom side of the die pad 30 to be contaminated, making the die bonding of the second semiconductor die 32b to the bottom side of the die pad 30 still have delamination problems.

Second, delamination would arise at the interface between the first semiconductor die 32a and the die pad 30. This is because during the die-bonding process for the second semiconductor die 32b, there is no support beneath the die pad 30 since the underneath of the die pad 30 is the void portion 36a.

Third, since the interface between each semiconductor die 32a or 32b and the die pad 30 is quite large in area, the CTE (Coefficient of Thermal Expansion) difference between them would cause delamination to the interface during the curing process.

Fourth, during the wire-bonding process for the first semiconductor die 32a, since the bottom side 340b of the inner leads 340 would come into direct contact with the fixture 38 which is heated up to 220° C., it would easily cause the bottom side 340b of the inner leads 340 to be oxidized and contaminated, which would degrade the bonding of the second set of bonding wires 33b.

Fifth, the die-bonding process requires the use of various kinds of fixtures, which would make equipment management quite laborious and time-consuming, and thus cost-ineffective to implement.

Sixth, during the die-bonding process, it would not be easy to align the two semiconductor dies 3a, 3b with respect to each other, which would degrade the quality of the resulting integrated circuit package. This is because the die-bonding process for the second semiconductor die 3b is carried out after the first semiconductor die 32a has already been mounted in position, making it difficult to provide a precise alignment.

Seventh, the wire-bonding process requires the use of various kinds of fixtures, which would make equipment management quite laborious and time-consuming, and thus cost-ineffective to implement.

U.S. Pat. No. 5,677,567 to Ma et al. discloses a multiple-die semiconductor package with a leadframe having a plurality of lead fingers and including at least one lead of non-uniform length and configuration that can attach to the semiconductor dies. For example, as shown in FIG. 9, a multiple die assembly 900 contains four dies 806, 808, 812, and 814, and leadframes 901 and 903. Each leadframe 901, 903 has leads extending between the dies from more than one side, e.g., leadframe 901 includes leads 902 extending from laterally opposite directions between dies 806 and 808. Additionally, paddles 906 and 908 are positioned between dies 806 and 808, and dies 812 and 814, respectively. Each paddle is arranged on the same lateral plane as the lead fingers, e.g., lead fingers 902 extend from either side between dies 806 and 808, and paddle 906 is positioned parallel to the lead fingers 902 on the same lateral plane. Dies 806, 808, 812 and 814 are supported primarily by leads 902 and 904, respectively, and each die can have its active surface 820, 826, 830, and 836 adhered to paddles 906 and 908. Because each leadframe 901, 903 is mounted with two dies respectively on opposite sides thereof, it is necessary to turn the leadframe upside-down for depositing a lattermounted die thereon, which requires additional steps in the manufacturing process.

In conclusion, the foregoing conventional packaging methods for dual-die integrated circuit packages are still unsatisfactory to use. There exists a new packaging method that can help eliminate the above-mentioned drawbacks of the prior art.

SUMMARY OF THE INVENTION

It is therefore an objective of this invention to provide a dual-die integrated circuit package, which can be manufactured using conventional equipment and processes.

It is another objective of this invention to provide a dual-die integrated circuit package structure, which allows the interface between each semiconductor die and the die pad to be small in area so as to reduce the occurrence of delamination.

It is still another objective of this invention to provide a dual-die integrated circuit package, which can be manufactured without causing contamination to both sides of the die pad and the functional surface of each semiconductor die.

It is yet another objective of this invention to provide a dual-die integrated circuit package, which can be manufactured in a more cost-effective manner than the prior art.

It is still yet another objective of this invention to provide a dual-die integrated circuit package, which allows the two semiconductor dies on the die pad to be easily aligned to each other.

In accordance with the foregoing and other objectives, the invention proposes a new dual-die integrated circuit package. The dual-die integrated circuit package of the invention includes the following constituent parts: (a) a first leadframe having a die pad and a plurality of leads disposed along one side of the die pad; (b) a second leadframe having a die pad and a plurality of leads disposed along one side of the die pad, wherein the die pads of the first and second leadframes are laterally positioned between the leads of the first leadframe and the leads of the second leadframe, and the die pad of the second leadframe is arranged in a staggered and laterally offset manner with respect to the die pad of the first leadframe; (c) a first semiconductor die having an active surface formed with a plurality of bonding pads thereon, and an inactive surface opposed to the active surface, the inactive surface having a portion thereof being adhered to the die pad of the first leadframe and a non-adhered portion being positioned away from the leads of the first leadframe; (d) a second semiconductor die having an active surface formed with a plurality of bonding pads thereon, and an inactive surface, the inactive surface having a portion thereof being adhered to the die pad of the second leadframe, and a non-adhered portion being positioned away from the leads of the second leadframe, wherein the non-adhered portion of the second semiconductor die is separated from the die pad of the first leadframe, and the non-adhered portion of the first semiconductor die is separated from the bottom surface of the die pad of the second leadframe, and wherein the die pads of first and second leadframes are each positioned in elevation between the first semiconductor die and the second semiconductor die; (e) a first set of electrical connection means for electrically coupling the bonding pads on the active surface of the first semiconductor die to the corresponding leads of the first leadframe; (f) a second set of electrical connection means for electrically coupling the bonding pads on the active surface of the second semiconductor die to the corresponding leads of the second leadframe; and (g) an encapsulant for encapsulating the first and second semiconductor dies, the die pads of the first and second leadframes, and a part of the leads of the first and second leadframes.

The foregoing dual-die integrated circuit package is characterized in the use of two leadframes, each having a die pad and a plurality of leads each defined into an inner lead and an outer lead. The two semiconductor dies are mounted on the respective die pads of the two leadframes, with the inactive bottom surface of each semiconductor die facing the inactive bottom surface of the other, allowing a clearance to be formed between the bottom surface of the second semiconductor die and the die pad of the first leadframe, and a clearance to be formed between the bottom surface of the first semiconductor die and the die pad of the second leadframe. Moreover, the die pad of the leadframe used in the invention is smaller in area than the semiconductor die so as to allow the die pad of the leadframe to be adhered to merely a part of the bottom surface of the semiconductor die. By this arrangement, delamination between the semiconductor die and the die pad of the leadframe can be eliminated due to the reduced interface between the semiconductor die and the die pad. To further decrease the interface between the semiconductor die and the die pad, the die pad can be formed with at least one opening. Therefore, this dual-die integrated circuit package can help prevent delamination and also allows the manufacture to be more cost-effective to implement than the prior art. The die pad may be vertically positioned downset relative to a second plane from a first plane where the leads are positioned so as to allow the leads of the first and second leadframes to be horizontally aligned, after the encapsulant is formed. This arrangement also permits that in the dual-die integrated circuit package of the invention, the first semiconductor die is held in proximity to the second semiconductor die as close as possible, and thereby makes the resulted integrated circuit package low in profile. In the manufacture process of the dual-die integrated circuit package of the invention, the die bond process for the first semiconductor die is the same as that for the second semiconductor die, thereby the die-bonding of the first semiconductor die can be simultaneously preformed with the die-bonding of the second semiconductor die with the same die bonded equipments and processes. As a result, the dual-die integrated circuit package of the invention is more cost-effective and time-efficient to manufacture than the prior art. Moreover, as the die bond process and the wire bond process need not to turn over the combined structure of the leadframe and the semiconductor die so that there exists no contamination concern which would otherwise cause delamination and/or degrade the wire bond quality.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1:
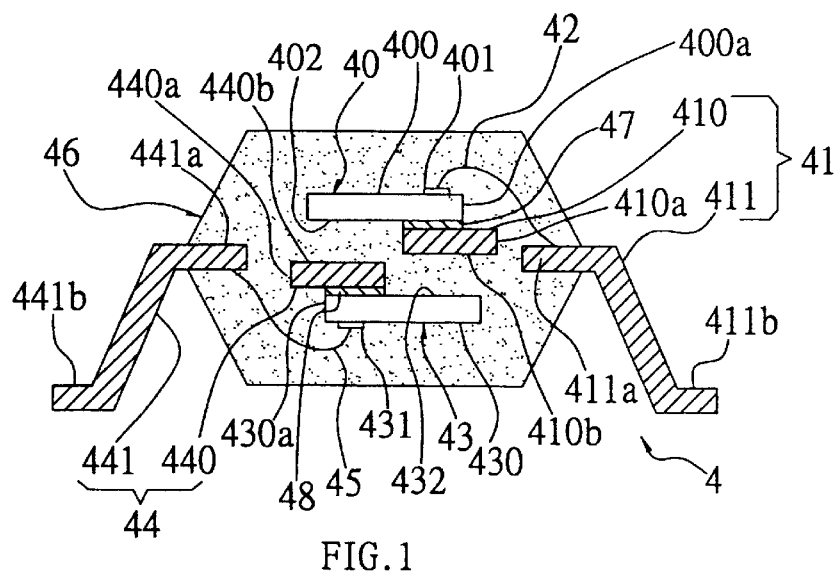
FIG. 1 is a schematic sectional diagram of the first preferred embodiment of the dual-die integrated circuit package structure of the invention.

FIG. 1 is a schematic sectional diagram of the first preferred embodiment of the dual-die integrated circuit package of the invention. As shown, the integrated circuit package 4 includes a first semiconductor die 40 and a second semiconductor die 43. Further, the package 4 includes a first leadframe 41 for mounting the first semiconductor die 40 and a second leadframe 44 for mounting the second semiconductor die 43. The first semiconductor die 40 is electrically coupled to the first leadframe 41 via a first set of bonding wires 42, while the second semiconductor die 43 is electrically coupled to the second leadframe 44 via a second set of bonding wires 45. An encapsulant 46 formed by a molding resin is used to encapsulate the first semiconductor die 40, the second semiconductor die 43, and the bonding wires 42 and 45.

Figure 2:
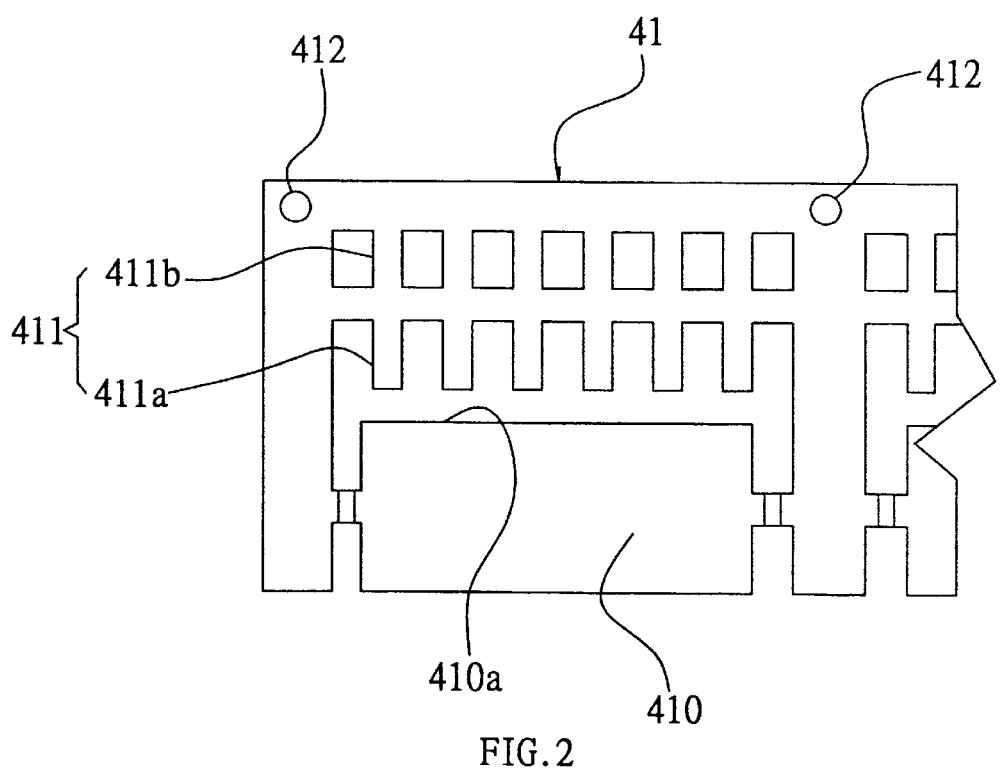
FIG. 2 is a schematic top view of a leadframe used in the dual-die integrated circuit package structure of FIG. 1.

Referring also to FIG. 2, the first leadframe 41 is formed with a die pad 410 and a plurality of leads 411 disposed along one side of the die pad 410 and linked to the same through tie bars. The leadframe 41 is a one-side-lead leadframe, such that leads 411 extend from a single direction into the integrated circuit package 4. As shown in FIG. 1, the die pad 410 is used to mount the first semiconductor die 40 thereon and is arranged to be downset in elevation from a lateral plane formed by the leads 411. The leads 411 are each further defined into an inner lead 411a and an outer lead 411b, wherein the inner lead part 411a is to be enclosed in the encapsulant 46, while the outer lead 411b is to be exposed to the outside of the encapsulant 46.

The second leadframe 44 is formed in the same manner as the first leadframe 41 shown in FIG. 2, which is formed with a die pad 440 and a plurality of leads 441 disposed along one side of the die pad 440. The second leadframe 44 is also a one-side-lead leadframe, such that leads 441 extend from a single direction (opposite in orientation to leads 411) into the integrated circuit package 4. The leads 441 are each further defined into an inner lead 441a and an outer lead 441b, wherein the inner lead 441a is to be enclosed in the encapsulant 46, while the outer lead 441b is to be exposed to the outside of the encapsulant 46. Further, the die pad 440 is also downset in elevation from a lateral plane formed by the leads 441.

The die pads 410 and 440 of the first and second leadframes 41 and 44, respectively, are laterally positioned between the leads 411 of the first leadframe 41 and the leads 441 of the second leadframe 44, wherein the die pad 410 of the first leadframe 41 is arranged in a staggered and laterally offset manner with respect to the die pad 440 of the second leadframe 44.

The first semiconductor die 40 has an active top surface 400 and an inactive bottom surface 402, and is formed with an array of bonding pads 401 (only one is visible in FIG. 1) on the top surface 400 near the edge corresponding to the leads 411. Further, the first semiconductor die 40 is mounted on the first leadframe 41 in such a manner that the bottom surface 402 has a portion thereof adhered to the die pad 410 of the first leadframe 41 and a non-adhered portion positioned away from the first leadframe 41. The bottom surface 402 is adhered to die pad 410 with silver paste 47, and the bonding pads 401 thereof are electrically connected to the inner leads 411a of the first leadframe 41 via the first set of bonding wires 42. Since the die pad 410 of the first leadframe 41 is smaller in dimension than the first semiconductor die 40, the die bond process should be performed in such a manner as to allow the peripheral side 410a of the die pad 410 to be positioned between the peripheral side 400a of the first semiconductor die 40 and the leads 411, for the purpose of preventing delamination at the interface between the first semiconductor die 40 and the die pad 410 of the first leadframe 41. Further, because a substantial portion of the bottom surface of the semiconductor die constitutes the non-adhered portion, the contact area between the semiconductor die and die pad can be reduced, thereby making delamination less likely to occur. Still further, an area of the die pad 410 is preferably smaller than half an area of the semiconductor die 40.

Similarly, the second semiconductor die 43 has an active top surface 430 and an inactive bottom surface 432 and is formed with an array bonding pads 431 (only one is visible in FIG. 1) on the top surface 430 near the edge corresponding to the leads 441 of the second leadframe 44. Further, the second semiconductor die 43 is mounted on the second leadframe 44 in such a manner that the bottom surface 432 has a portion thereof adhered to the die pad 440 of the second leadframe 44 and a non-adhered portion positioned away from the second leadframe 44. The bottom surface 432 is adhered to die pad 440 with silver paste 48, and the bonding pads 431 thereof are electrically connected to the inner leads 441a of the second leadframe 44 via the second set of bonding wires 45. Since the die pad 440 of the second leadframe 44 is smaller in dimension than the second semiconductor die 43, the die-bond process should be performed in such a manner as to allow the peripheral side 440a of the die pad 440 to position between the peripheral side 430a of the second semiconductor die 43 and the leads 441, for the purpose of preventing delamination at the interface between the second semiconductor die 43 and the die pad 440 of the second leadframe 44. Similarly, because a substantial portion of the bottom surface of the semiconductor die constitutes the non-adhered portion, the contact area between the semiconductor die and die pad can be reduced, thereby making delamination less likely to occur. Further, an area of the die pad 440 is preferably smaller than half an area of the semiconductor die 43.

After being mounted in position, the two semiconductor dies 40, 43 are separated from each other by a distance, with the bottom surface 402 of the first semiconductor die 40 facing the bottom surface 432 of the second semiconductor die 43. To allow the overall integrated circuit package size to be as small as possible, the bottom side 410*b* of the die pad 410 of the first leadframe 41 is preferably positioned below the upper side 440*b* of the die pad 440 of the second leadframe 44, while allowing the die pad 410 of the first leadframe 41 to be separated from the die pad 440 of the second leadframe 44. In addition, the die-bonding and wire-bonding process is performed for both leadframes 41 and 44 simultaneously, without turning the leadframes upside down for die bonding; in comparison, a conventional dual-die package adopts one single leadframe, and the leadframe mounted with a first die is turned upside down for disposing a second die thereon.

Figure 4:
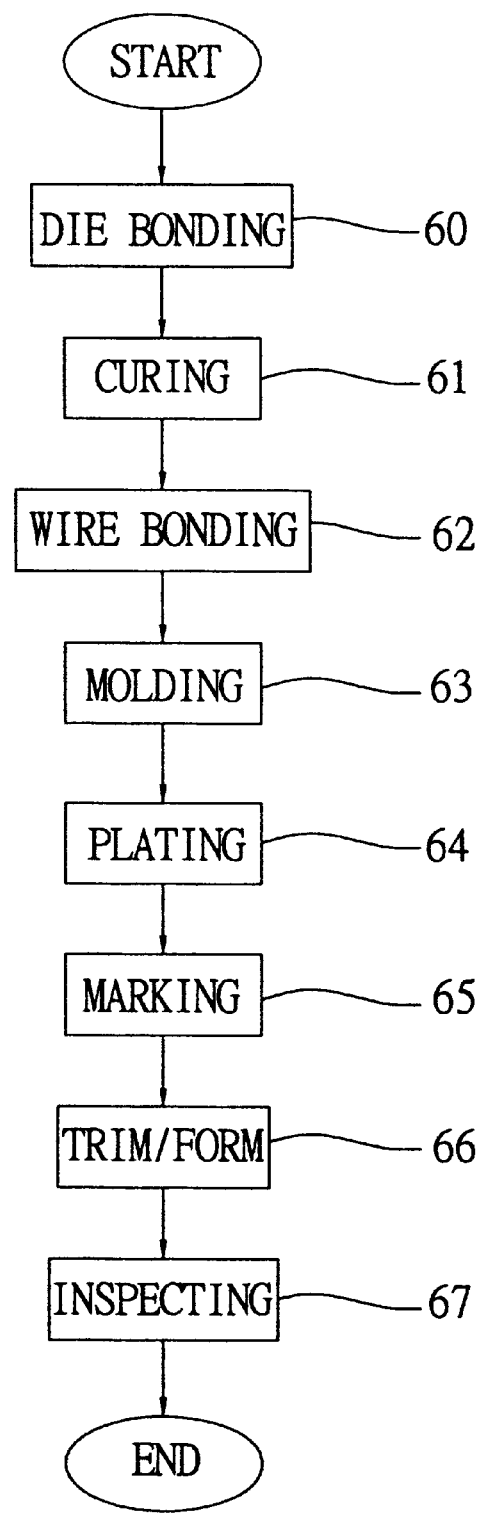
FIG. 4 is a flow diagram showing the procedural steps involved in the process for manufacturing the dual-die integrated circuit package structure of FIG. 1.

FIG. 4 is a flow diagram showing the procedural steps involved in the process for manufacturing the dual-die integrated circuit package of FIG. 1.

As shown, the first step 60 is to perform a die bond process, by which the first semiconductor die 40 is adhered onto the first leadframe 41 with the silver paste 47, while the second semiconductor die 43 is adhered onto the second leadframe 44 with the silver paste 48. It is a characteristic feature of this die bond process that the two semiconductor dies 40, 43 can be bonded at the same time to the first and second leadframes 41, 43, respectively, without having to bond them in a successive manner as in the case of the prior art; and therefore, the invention can help prevent the semiconductor dies from being damaged or contaminated during die bonding.

In the next step 61, a curing process is performed to harden the silver paste 47 and 48 respectively used to adhere the first semiconductor die 40 in position on the die pad 410 of the first leadframe 41 and the second semiconductor die 43 in position on the die pad 440 of the second leadframe 44.

In the next step 62, a wire bond process is performed to electrically connect the first set of bonding wires 42 between the bonding pads 401 and the inner leads 411*a* of the leads 411 of the first leadframe 41 and also connect the second set of bonding wires 45 between the bonding pads 431 and the inner leads 441*a* the leads 441 of the second leadframe 44. This allows the two semiconductor dies 40, 43 to be electrically coupled to the leads 411 and 441. It is a characteristic feature of this wire bond process that the first and second sets of bonding wires 42, 45 can be bonded concurrently without having to perform it in two steps, so that the overall manufacture process can be more cost-effective to implement than the prior art. Moreover, it can help prevent the leads from being contaminated during the wire bond process as in the case of the prior art.

Figure 3:
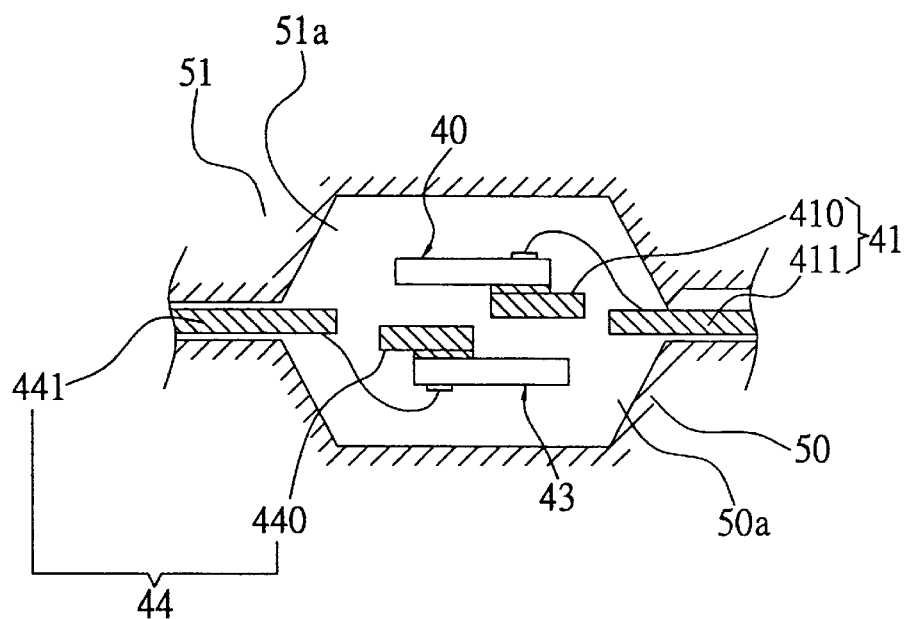
FIG. 3 is a schematic sectional diagram used to depict how a molding process is performed to encapsulate the semiconductor dies in the dual-die integrated circuit package structure of FIG. 1.

In the next step 63, a transfer molding process is performed to form an encapsulant 46 for encapsulating the two semiconductor dies 40, 43. Referring to FIG. 3, prior to the beginning of this transfer molding process, the semi-finished package structure comprising the second semiconductor die 43 and the second leadframe 44 is turned upside down and clamped in position between a lower mold 50 and a upper mold 51, in a manner that, the second semiconductor die 43 is positioned within the a lower cavity 50*a* of the lower mold 50. The second leadframe 44 is secured by means of fixation means (not shown) on the lower mold 50 so that the second leadframe 44 can be firmly fixed in position during the transfer molding process. In a similar manner, the semi-finished package structure comprising the first semiconductor die 40 and the first leadframe 41 is concurrently clamped in position between the lower mold 50 and the upper mold 51, allowing the first semiconductor die 40 to be positioned within the upper cavity 51*a* of the upper mold 51. The first leadframe 41 is secured by means of fixation means (not shown) on the lower mold 50 so that the first leadframe 41 can be firmly fixed in position during the transfer molding process. The encapsulant 46 thus-formed encapsulates the inner leads 411*a* of the first leadframe 41 and the inner leads 441*a* of the second leadframe 44, while exposing the outer-lead part 411*b* of the first leadframe 41 and the outer leads 441*b* of the second leadframe 41.

Subsequently, a plating step 64, a marking step 65, a trim/form step 66, and an inspection step 67 are performed to complete the manufacture of the dual-die integrated circuit package. These steps all employ conventional techniques and are not within the spirit and scope of the invention, so description thereof will not be further detailed.

Second Preferred Embodiment

Figure 5:
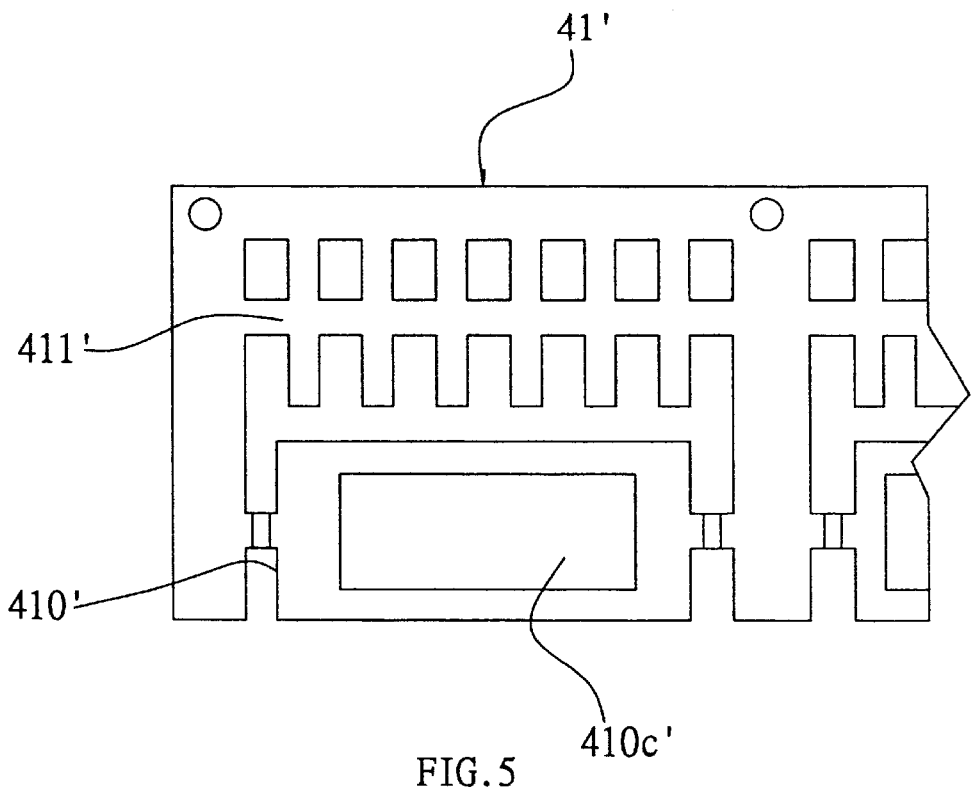
FIG. 5 is a schematic top view of a leadframe used in the second preferred embodiment of the dual-die integrated circuit package structure of the invention.
Figure 6:
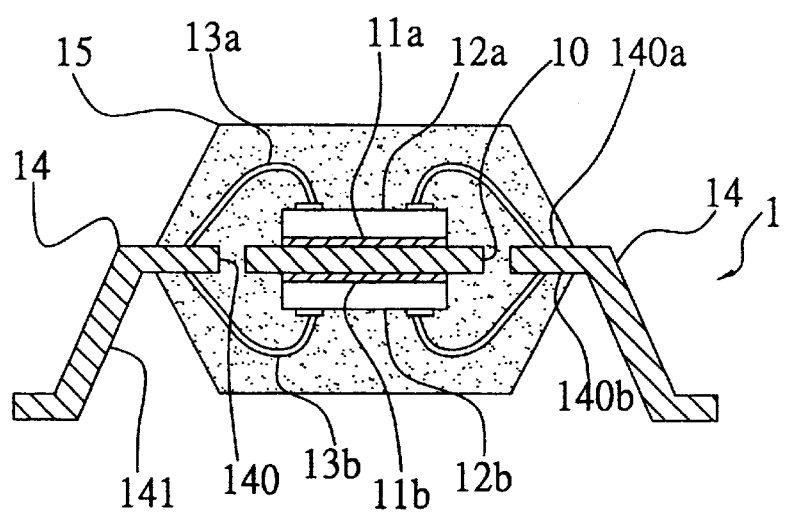
FIG. 6 (PRIOR ART) is a schematic sectional diagram of a first conventional dual-die integrated circuit package structure.
Figure 7:
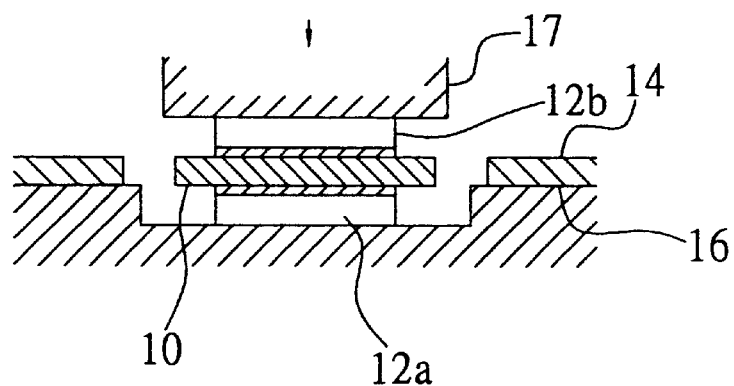
FIG. 7 (PRIOR ART) is a schematic sectional diagram used to depict the die-bonding process used to manufacture the dual-die integrated circuit package structure of FIG. 6.
Figure 8:
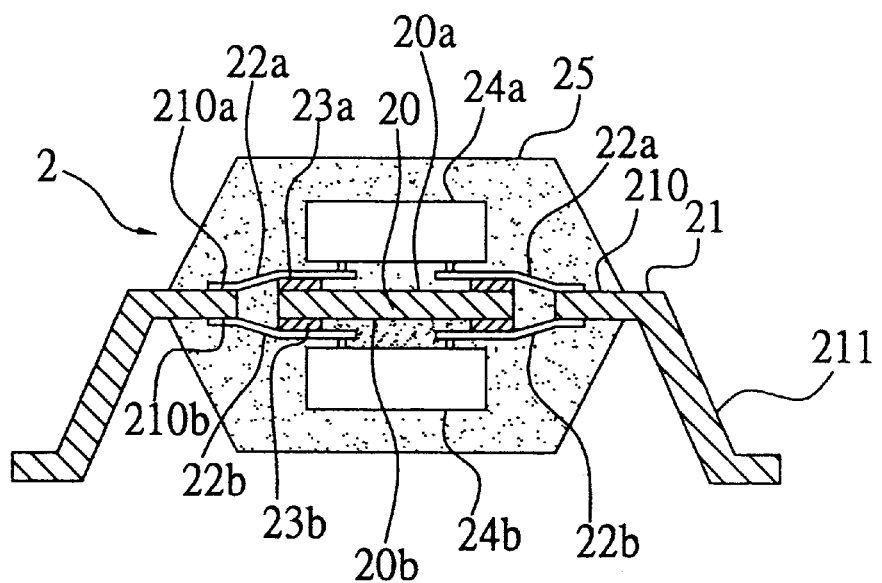
FIG. 8 (PRIOR ART) is a schematic sectional diagram of a second conventional dual-die integrated circuit package structure.
Figure 9:
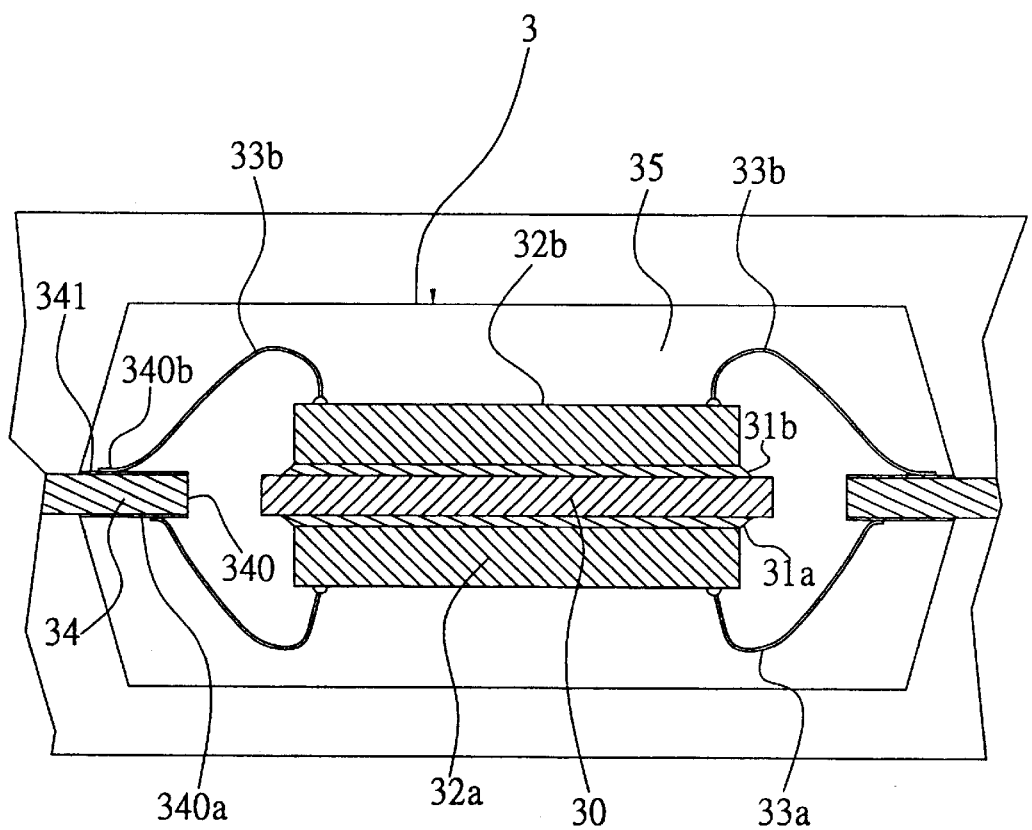
FIG. 9 (PRIOR ART) is a schematic sectional diagram of a third conventional dual-die integrated circuit package structure.
Figure 10A:
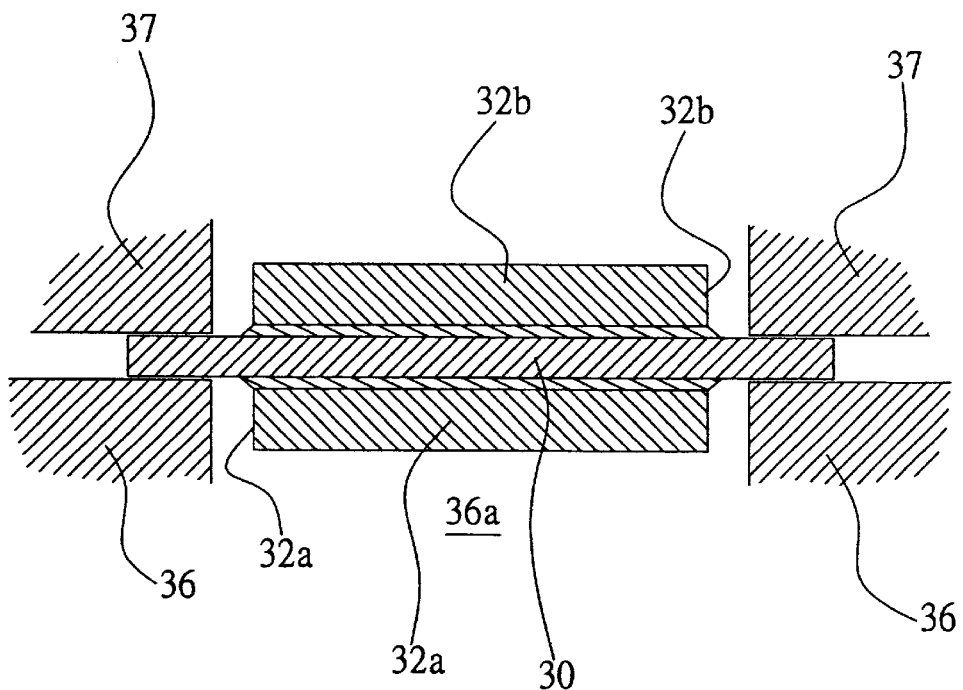
FIG. 10A (PRIOR ART) is a schematic sectional diagram used to depict the die-bonding process used to manufacture the dual-die integrated circuit package structure of FIG. 9.
Figure 10B:
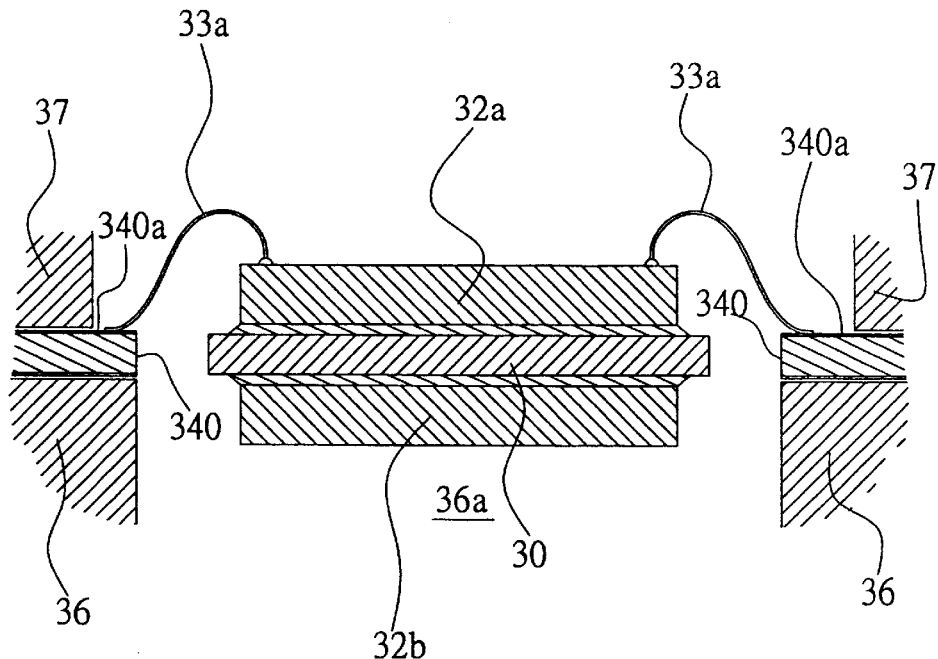
FIG. 10B (PRIOR ART) is a schematic sectional diagram used to depict a first step of the wire-bonding process used in the manufacture of the dual-die integrated circuit package structure of FIG. 9.
Figure 10C:
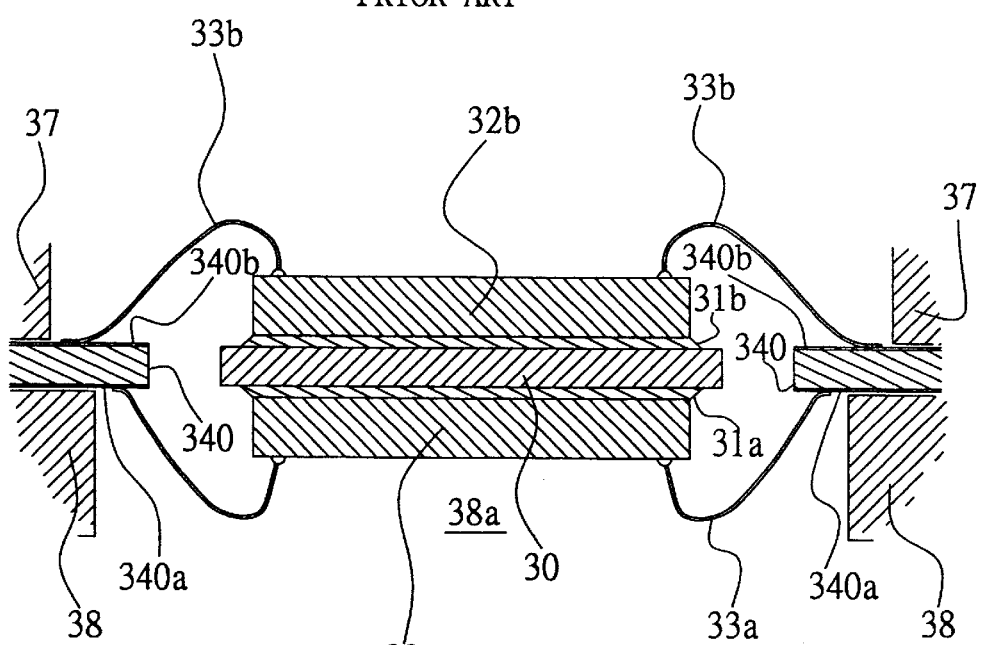
FIG. 10C (PRIOR ART) is a schematic sectional diagram used to depict a second step of the wire-bonding process used in the manufacture of the dual-die integrated circuit package structure of FIG. 9.

FIG. 5 is a schematic top view of a leadframe used in the second preferred embodiment of the dual-die integrated circuit package structure of the invention.

As shown, this leadframe 41' is also formed with a die pad 410' and a lead portion 411' including a plurality of leads surrounding the die pad 410', and which differs from the one shown in FIG. 2 used in the previous embodiment only in that a hole 410*c*' is formed in the center of the die pad 410*c*'. This hole 410*c*' can be formed in any shape, such as a circle, a square, a rectangular, or a polygon. This can help save material cost of the leadframe.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual semiconductor die integrated circuit package, which comprises:

a first leadframe having a die pad and a plurality of leads disposed along one side of the die pad;

a second leadframe having a die pad and a plurality of leads disposed along one side of the die pad, wherein the die pads of the first and second leadframes are laterally positioned between the leads of the first leadframe and the leads of the second leadframe, and the die pad of the second leadframe is arranged in a staggered and laterally offset manner with respect to the die pad of the first leadframe;

a first semiconductor die having an active surface formed with a plurality of bonding pads thereon, and an inactive surface opposed to the active surface, the inactive surface having a portion thereof being adhered to the die pad of the first leadframe, and a non-adhered portion being positioned away from the leads of the first leadframe;

a second semiconductor die having an active surface formed with a plurality of bonding pads thereon, and an inactive surface opposed to the active surface, the inactive surface having a portion thereof being adhered to the die pad of the second leadframe, and a non-adhered portion being positioned away from the leads of the second leadframe, wherein the non-adhered portion of the second semiconductor die is separated from the die pad of the first leadframe, and the non-adhered portion of the first semiconductor die is separated from the die pad of the second leadframe, and wherein the die pads of first and second leadframes are each positioned in elevation between the first semiconductor die and the second semiconductor die;

a first set of electrical connection means for electrically coupling the bonding pads on the active surface of the first semiconductor die to the corresponding leads of the first leadframe;

a second set of electrical connection means for electrically coupling the bonding pads on the active surface of the second semiconductor die to the corresponding leads of the second leadframe; and an encapsulant for encapsulating the first and second semiconductor dies, the die pads of the first and second leadframes, and a part of the leads of the first and second leadframes.

2. The dual semiconductor die integrated circuit package of claim 1, wherein the first and second leadframes each have at least an opening formed in the center of the die pad thereof.

3. The dual semiconductor die integrated circuit package of claim 1, wherein the die pad of the first leadframe is smaller in dimension than the first semiconductor die, while the die pad of the second leadframe is smaller in dimension than the second semiconductor die.

4. The dual semiconductor die integrated circuit package of claim 1, wherein an area of the die pad of the first leadframe is smaller than half an area of the first semiconductor die, while an area of the die pad of the second leadframe is smaller than half an area of the second semiconductor die.

5. The dual semiconductor die integrated circuit package of claim 1, wherein the die pad of the first leadframe is spaced in elevation from a plane formed by the leads of the first leadframe, and the die pad of the second leadframe is spaced in elevation from a plane formed by the leads of the second leadframe.

6. The dual semiconductor die integrated circuit package of claim 1, wherein the bonding pads on the active surface of the first semiconductor die are formed in proximity to the leads of the first leadframe, while the bonding pads on the active surface of the second semiconductor die are formed in proximity to the leads of the second leadframe.

7. The dual semiconductor die integrated circuit package of claim 1, wherein the leads of the first and second leadframes are each defined by an inner lead and an outer lead.

8. The dual semiconductor die integrated circuit package of claim 7, wherein the inner leads of the first and second leadframes are encapsulated in the encapsulant, while the outer leads thereof are exposed to outside of the encapsulant.

9. The dual semiconductor die integrated circuit package of claim 5, wherein the inactive surface of the first semiconductor die is arranged at a higher elevation than the inactive surface of the second semiconductor die.

10. The dual semiconductor die integrated circuit package of claim 1, wherein the inactive surface of the first semiconductor die faces the inactive surface of the second semiconductor die.

11. The dual semiconductor die integrated circuit package of claim 1, wherein the electrical connection means are bonding wires.

* * * * *